United States Patent [19]

Minato et al.

[11] Patent Number: 4,749,436
[45] Date of Patent: Jun. 7, 1988

[54] EQUIPMENT FOR THERMAL STABILIZATION PROCESS OF PHOTORESIST PATTERN ON SEMICONDUCTOR WAFER

[75] Inventors: Mitsuaki Minato; Isamu Hijikata; Akira Uehara, all of Kanagawa; Muneo Nakayama, Tokyo, all of Japan

[73] Assignee: Tokyo Ohka Kogyo Co., Ltd., Kanagawa, Japan

[21] Appl. No.: 79,257

[22] Filed: Jul. 29, 1987

[30] Foreign Application Priority Data

Nov. 19, 1986 [JP] Japan .................. 61-276136

[51] Int. Cl.$^4$ .................. B44C 1/22; B29C 37/00; C03C 15/00; C03C 25/06
[52] U.S. Cl. .................. 156/345; 156/643; 156/656; 156/659.1; 156/668; 156/626; 427/43.1; 427/54.1; 430/313; 430/330
[58] Field of Search .............. 156/345, 643, 646, 653, 156/656, 657, 659.1, 668, 626; 427/43.1, 54.1; 430/313, 317, 318, 330, 350; 118/728, 50.1, 620; 354/150, 297

[56] References Cited

FOREIGN PATENT DOCUMENTS 61-97834  6/1986  Japan .

*Primary Examiner*—William A. Powell
*Attorney, Agent, or Firm*—Bogucki, Scherlacher, Mok & Roth

[57] ABSTRACT

An equipment (100; 200) for thermal stabilization process of photoresist pattern on semiconductor wafer comprises an ultraviolet lamp (20) by which a photoresist pattern formed on a semiconductor wafer (W) put in a process chamber (S) under vacuum pressure is irradiated with ultraviolet rays of a predetermined strength, and a heater (10) for heating the wafer to a predetermined temperature.

6 Claims, 2 Drawing Sheets

EQUIPMENT FOR THERMAL STABILIZATION PROCESS OF PHOTORESIST PATTERN ON SEMICONDUCTOR WAFER

BACKGROUND OF THE INVENTION

1. Field of the Invention

The present invention relates generally to an equipment for thermal stabilization process, and more particularly to an equipment for a thermal stabilization process of the photoresist pattern on the semiconductor wafer.

2. Description of Relevant Art

There are extensively produced semiconductor devices with high integrity, such as LSI's and VLSI's in recent years. Those devices are produced by repetition of a number of processes such as for the formation of an insulating or conductive film on the surface of a semiconductor wafer and for the etching of such a film. Exemplarily, in the case of an insulating film formed on a wafer, the etching includes a photo-lithographic process for forming a minute photoresist pattern on the insulating film, followed by a plasma etching process as a dry etching of the film, where the photoresist pattern serves as a mask.

The photoresist pattern formed by photo-lithography is insufficient of resistance to heat, and may deform if directly subjected to plasma, with a resulted difficulty in achieving a proper minute etching in the submicron order.

To overcome such a problem, there are conventionally known curing processes in which the photoresist pattern on the wafer is hardened by irradiation of ultraviolet ray.

For such a process, an equipment is proposed in Japanese Utility Model Laying-Open Gazette No. 61-97834. The equipment has a leftwardly and rightwardly openable cylindrical casing and a processing chamber installed therein, with a plurality of ultraviolet lamps verticalyy arranged therebetween. The processing chamber permits insertion of a cassette with many wafers piled to be held therein. Each lamp is provided with a transparent cover to allow circulation of cooling water through a space defined therebetween.

In the equipment, however, the cassette holds many wafers, so that the irradiation of ultraviolet ray thereto may be uneven. The photoresist pattern on each wafer may be cured ununiform in resistance to heat or thermal stability. It may thus be difficult to perform a correct etching.

It is desirable for improvement in thermal stability of photoresist to possibly eliminate residual moisture and solvent therein, in addition to curing by ultraviolet irradiation. Such elimination may be effected by heating the photoresist during the ultraviolet irradiation under a vacuum pressure. It however is difficult for the equipment according to the Japanese Gazette, in which many wafers are piled in the cassete, to concurrently perform both heating and ultraviolet irradiation under vacuum pressure, under given conditions.

The present invention has been achieved to effectively solve such a problem in conventional equipment for thermal stabilization process of photoresist pattern on semiconductor wafer.

SUMMARY OF THE INVENTION

An object of the present invention is to provide an equipment for a thermal stabilization process including a heating and ultraviolet irradation of the photoresist pattern on the semiconductor wafer, in which the heating and ultraviolet irradiation can be concurrently performed under a vacuum pressure, under given conditions.

To achieve the object, the present invention provides an equipment for thermal stabilization process of photoresist pattern on semiconductor wafer comprising a hermetically sealable process chamber in which a semiconductor wafer formed with a photoresist pattern is put, an ultraviolet lamp for irradiating the photoresist pattern with ultraviolet rays of a predetermined strength, a means for reducing the inner pressure of the process chamber to a predetermined value, and a means for heating the semiconductor wafer to a predetermined temperature.

The above and further features, objects and advantages of the present invention will more fully appear from the following detailed description of the preferred embodiment of the invention when the same is read in conjunction with the accompanying drawings.

DETAILED DESCRIPTION OF THE PREFERRED EMBODIMENT

Figure 1:
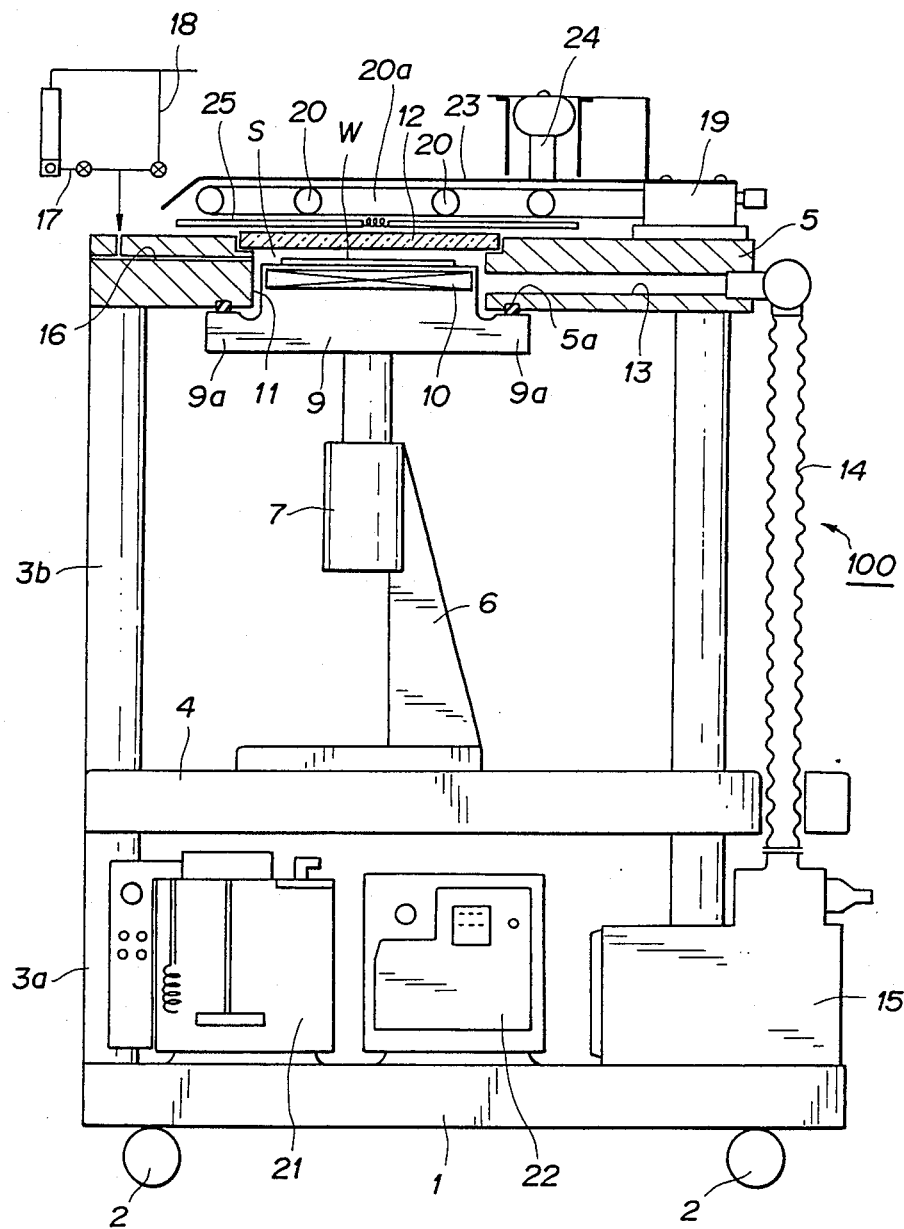
FIG. 1 is a side view, partly in section, of the entirety of an equipment for thermal stabilization process of photoresist pattern on semiconductor wafer according to a first embodiment of the invention.

Referring to FIG. 1, designated at reference numeral 100 is an equipment for thermal stabilization process of photoresist pattern on semiconductor wafer according to a first embodiment of the invention. The equipment 100 has a carrying base 1 with casters 2 on the downside. The base 1 carries struts 3a for receiving a support plate 4, which supports a table 5 by struts 3b. On the plate 4 there is fixed a vertically extending bracket 6 which has at the upper end a lifting member 7 for lifting a stage 9.

On the top base of stage 9 there is put a semiconductor wafer W on which a positive photoresist pattern is formed by photo-lithography. A temperature controlling heater 10 consisting of a hot plate or the like is provided in the stage 9, under the top base. The stage 9 has a laterally flanged part 9a at a lower level than the heater 10. The flanged part 9a abuts on a seal member 5a around a through opening 11 of table 5 to hermetically close the opening 11, when the stage 9 is lifted up from under table 5. The upside aperture of opening 11 is hermetcally closed with a transparent plate 12 made from a quartz or the like. The plate 12 serves as a chamber cover that cooperates with stage 9 to define a process chamber S. Air in the chamber S can be suctioned by a vacuum pump 15 on the base 1, through a suction path 13 formed in the table 5 and a flexible bellows tube 14. Chamber S is connected, through a communication path 16 formed in the table 5, to a gas feed line 17 which feeds an inert gas such as a nitrogen gas, and a purge line 18 of which the free end is open to the atmosphere and which can restore the inner pressure of chamber S to an atmospheric level. A support block 19 is installed on the table 5 to hold ultraviolet lamps 20 in position over the transparent plate 12. The lamps 20 may exemplarily be a mercury-arc or -vapor lamp of low, high or ultra-high tension or xenon lamp or the like, and have an arbitrary configuration such as a straight or curved. Lamps 20 are accommodated in a cover member 20a through which cooling water is circulated by means of an unshown circulation line connected to a cooling device 21 with a built-in circulation pump. The device 21 is installed on the base 1. Between the device 21 and vacuum pump 15 on the base 1 there is disposed a power source 22 for necessary power application, for example, to heater 10 and lamps 20.

The ultraviolet lamps 20 are provided with a reflecting cover 23 on which an illumination monitor 24 is installed. Between lamps 20 and transparent plate 12 there is interposed a shutter 25. The monitor 24 is connected to an unshown control unit which computes the process time to thereby automatically control the operation of shutter 25 as well as the transfer of wafer W.

The equipment 100 is for performing a thermal stabilization process of photoresist pattern on wafer W, which will be described below.

The stage 9 is first set at an original position lower than shown in FIG. 1. With an unshown power switch on, electric power is applied to heater 10 and ultraviolet lamps 20. Lamps 20 goes on, heater 10 has a rising temperature. The illumination intensity of lamps 20 is increased to a predetermined level of 40 mW/cm$^2$ with a wavelength of 253.7 nm, for example, which the monitor 24 detects. The temperature of heater 10 is raised to a predetermined range of 60° C. to 150° C., for example, and the pressure of cooling water is increased to a predetermined value, which unshown sensors detect. Wafer W with a photoresist pattern formed thereon is then put on stage 9. The stage 9 is lifted up to the shown position in FIG. 1, so that wafer W is placed in the process chamber S. Concurrently, the bottom of chamber S is hermetically closed with the flanged part 9a of stage 9 and the seal member 5a.

The vacuum pump 15 is then operated to suction air of the chamber S, so that the inner pressure of chamber S is reduced below 30 torr. Thereafter, chamber S is fed with inert gas from the line 17 and path 16, as necessary. After confirmation of illumination strength by the monitor 24, shutter 25 is opened, so that the photoresist pattern on wafer W is irradiated with ultraviolet rays under a vacuum pressure and concurrently heated by the heater 10. Such an ultraviolet irradiation and heating process is continued for a period within a range of 1 to 20 minutes, depending on the film thickness and type of photoresist. The photoresist pattern is cured by the ultraviolet irradiation. Moisture, solvent and the like contained in the photoresist are effectively vaporized by the heating under vacuum pressure. Vapors from the photoresist during the process are pumped to be exhausted outside, while an inert gas such as N$_2$ is introduced through the line 17 and path 16 into chamber S to prevent the deposition of vaporized materials on transparent plate 12.

Upon completion of the process the inert gas feed line 17 is closed, when the purge line 18 is opened to admit a flow of filtered atmospheric air into the chamber S which thus has an increased inner pressure of approx. 760 torr. Thereafter, the stage 9 is lifted down. Wafer W is taken out and put in an unshown cassette.

In the equipment 100, the photoresist pattern on wafer W is subjected to both ultraviolet irradiation and heating under vacuum pressure. The curing of photoresist pattern and vaporization such as of moisture and solvent therein are concurrently performed under vacuum pressure, under given conditions. The thermal stability of photoresist pattern is thus uniformly improved, permitting an etching with high precision. The control of illumination strength and heating temperature is facilitated so that the process can be efficiently performed. The introduction of an inert gas such as N$_2$ protects ultraviolet lamps 20 as well as transparent plate 12 aginst the deposition of vaporized materials from the photoresist. The cleaning of equipment 100 is thus possibly facilitated, resulting in an increased working efficiency and an improved quality of reproduction.

Figure 2:
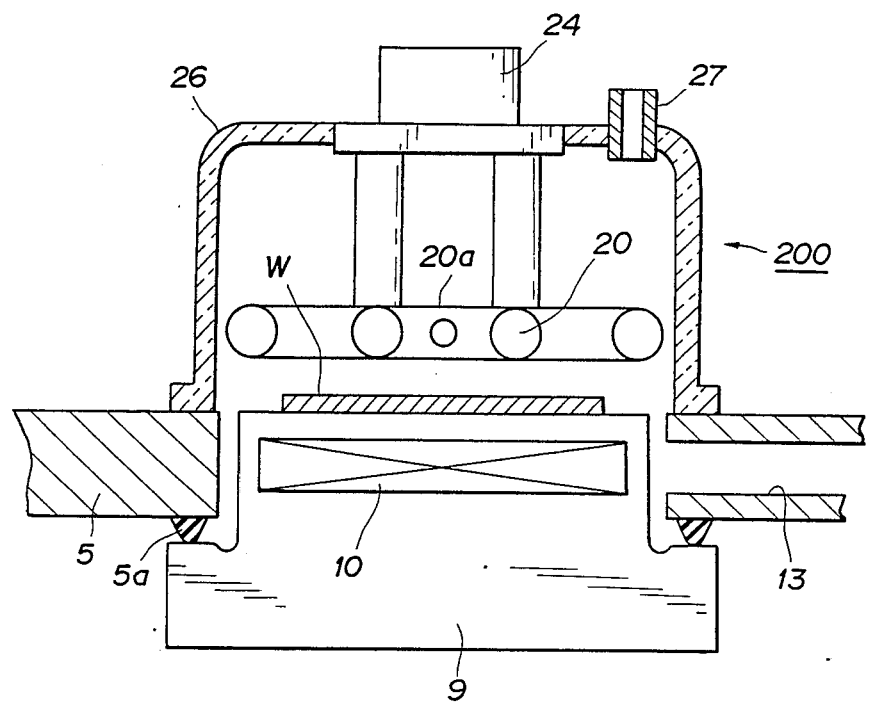
FIG. 2 is a sectional view of an essential part of an equipment for thermal stabilization process of photoresist pattern on semiconductor wafer according to the second embodiment of the invention.

FIG. 2 shows an essential part of an equipment 200 for thermal stabilization process according to a second embodiment of the invention. Like parts are designated by like reference numbers, without further description.

A bell-form chamber cover 26 made of a synthetic quartz material is employed in place of the flat transparent plate 12 of equipment 100, to enclose an opening of a table 5 from thereabove. Ultraviolet lamps 20 are arranged in the cover 26. An inert gas feed pipe 27 as well as an illumination monitor 24 is fitted at the top of cover 26. Like process to the equipment 100 can be performed by the equipment 200. The latter however has no shutter, so that a wafer W is brought into a process chamber in the cover 26, when a predetermined illumination strength is reached.

In the equipment 200 also, like effects to the equipment 100 can be achieved, notwithstanding the simplified structure without shutter.

In a modification, the provision of a lifting stage 9 may preferably be eliminated by employing a table of which a corresponding part has a built-in heater and a suitable transfer mechanism for lateral access of wafer W.

Further, in the first and second embodiments, the arrangment of illumination monitor 24 over ultraviolet lamps 20 may be changed to have a sensing element disposed aside of wafer W as a work to be processed.

Although there has been described what is at present considered to be the preferred embodiment of the invention, it will be understood that the present invention may be embodied in other specific forms without departing from the spirit or essential characteristics thereof. The present invention is therefore to be considered in all respects as illustrative but not restrictive. The scope of the invention is indicated by the appended claims rather than by the foregoing description.

We claim:

1. An equipment for thermal stabilization process of photoresist pattern on semiconductor wafer, comprising:
    a hermetically sealable process chamber in which a semiconductor wafer formed with a photoresist pattern is put;
    an ultraviolet lamp for irradiating said photoresist pattern with ultraviolet rays of a predetermined strength;
    a means for reducing the inner pressure of said process chamber to a predetermined value; and
    a means for heating said semiconductor wafer to a predetermined temperature.

2. An equipment for thermal stabilization process according to claim 1, wherein:
    said equipment further comprises a table with an opening formed therethrough, a stage on which said semiconductor wafer is put and which hermetically closes the aperture at one end of said opening, and a chamber cover for hermetically closing the aperture at the other end of said opening;

said process chamber is defined by cooperation of said opening of said table, said stage, and said chamber cover;

said reducing means comprises a suction path formed in said table in communication with said process chamber, and a suctioning means connected to said suction path; and said heating means comprises a heater built in said stage.

3. An equipment for thermal stabilization process according to claim 2, wherein:

said chamber cover comprises a transparent plate;

said ultraviolet lamp is disposed outside of said transparent plate; and said table is formed with a communication path for selectively connecting said process chamber to an inert gas feed line and a purge line.

4. An equipment for thermal stabilization process according to claim 3, further comprising:

a shutter interposed between said ultraviolet lamp and said chamber cover.

5. An equipment for thermal stabilization process according to claim 2, wherein:

said ultraviolet lamp is disposed in said process chamber; and said chamber cover is provided with an admission pipe for selectively connecting said process chamber to an inert gas feed line and a purge line.

6. An equipment for thermal stabilization process according to claim 2, further comprising:

a control system including an illumination monitor for monitoring an illumination strength of said ultraviolet lamp, and a control unit for computing a process time to thereby automatically control the operation of said shutter and the transfer of said semiconductor wafer.

* * * * *